(12) United States Patent
Steudel et al.

(10) Patent No.: US 7,700,148 B2
(45) Date of Patent: Apr. 20, 2010

(54) ELECTROLUMINESCENT DEVICE

(75) Inventors: Annette Steudel, Cambridge (GB); Nigel Male, Cambridge (GB); Scott Watkins, Williamstown (AU)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 11/377,613

(22) Filed: Mar. 17, 2006

(65) Prior Publication Data

US 2006/0216411 A1 Sep. 28, 2006

Related U.S. Application Data

(63) Continuation of application No. PCT/GB2004/004024, filed on Sep. 17, 2004.

(30) Foreign Application Priority Data

Sep. 17, 2003 (GB) ................................. 0321781.7

(51) Int. Cl.
*H01L 51/54* (2006.01)
*H01L 51/56* (2006.01)

(52) U.S. Cl. .................. 427/66; 428/690; 428/917; 313/504; 257/40

(58) Field of Classification Search ................ 428/690, 428/917; 313/504, 506; 257/40, E51.028, 257/E51.033, E51.027, 102, 103, 79, 80, 257/100, 101
See application file for complete search history.

(56) References Cited

U.S. PATENT DOCUMENTS

| 4,539,507 A | 9/1985 | VanSlyke et al. ............ 313/504 |
| 5,061,569 A | 10/1991 | VanSlyke et al. ............ 428/457 |
| 5,141,671 A | 8/1992 | Bryan et al. ............ 252/301.16 |
| 5,150,006 A | 9/1992 | Van Slyke et al. ........... 313/504 |
| 5,432,014 A | 7/1995 | Sano et al. ................... 428/690 |
| 5,554,450 A | 9/1996 | Shi et al. ..................... 428/690 |
| 5,593,788 A | 1/1997 | Shi et al. ..................... 428/690 |
| 5,705,284 A | 1/1998 | Hosokawa et al. .......... 428/690 |
| 5,723,873 A | 3/1998 | Yang ........................... 257/90 |

(Continued)

FOREIGN PATENT DOCUMENTS

EP 0 449 125 A2 10/1991

(Continued)

OTHER PUBLICATIONS

International Preliminary Report on Patentability, dated Mar. 21, 2006.

(Continued)

*Primary Examiner*—D. Lawrence Tarazano
*Assistant Examiner*—Camie S Thompson

(57) ABSTRACT

A method of forming an electroluminescent device comprising the steps of:
  providing a substrate comprising a first electrode for injecting charge carriers of a first type;
  forming an electroluminescent layer having a surface by depositing onto the substrate a composition comprising a host material and a light-emitting dopant monomer of formula (I):

$$A\text{-}C\text{—}(X)_n \qquad (I)$$

wherein X represents a polymerisable group; A represents a light-emitting group; C represents a bond or a spacer group and n is an integer;
  rendering at least some of the electroluminescent layer insoluble in a solvent by polymerising the monomer of formula (I);
  exposing the electroluminescent layer to the solvent; and
  depositing a second electrode capable of injecting charge carriers of a second type over the electroluminescent layer.

6 Claims, 2 Drawing Sheets

U.S. PATENT DOCUMENTS

| | | | | |
|---|---|---|---|---|
| 5,747,183 | A | 5/1998 | Shi et al. | 428/690 |
| 5,798,170 | A | 8/1998 | Zhang et al. | 428/212 |
| 5,853,905 | A | 12/1998 | So et al. | 428/690 |
| 5,908,581 | A | 6/1999 | Chen et al. | 252/301.16 |
| 5,972,247 | A | 10/1999 | Shi et al. | 252/583 |
| 6,020,078 | A | 2/2000 | Chen et al. | 428/690 |
| 6,083,634 | A | 7/2000 | Shi | 428/690 |
| 6,107,452 | A | 8/2000 | Miller et al. | 528/422 |
| 6,870,198 | B2 * | 3/2005 | Kim et al. | 257/103 |
| 2002/0117662 | A1 | 8/2002 | Ni | 257/40 |
| 2002/0182441 | A1 | 12/2002 | Lamansky et al. | 428/690 |
| 2003/0059646 | A1 | 3/2003 | Kamatani et al. | 428/690 |
| 2003/0068526 | A1 | 4/2003 | Kamatani et al. | 428/690 |
| 2004/0147555 | A1 | 7/2004 | Fujimoto et al. | 514/317 |
| 2005/0186443 | A1 * | 8/2005 | Marrocco et al. | 428/690 |
| 2005/0208335 | A1 | 9/2005 | Kamatani et al. | 428/690 |
| 2006/0057423 | A1 * | 3/2006 | Steudel et al. | 428/690 |

FOREIGN PATENT DOCUMENTS

| | | |
|---|---|---|
| EP | 492953 | 7/1992 |
| EP | 0 765 106 | 3/1997 |
| EP | 0 901 176 A2 | 3/1999 |
| EP | 0 947 123 B1 | 10/1999 |
| EP | 1 245 659 A1 | 10/2002 |
| JP | 10-144469 * | 5/1999 |
| JP | 2002-324679 | 11/2002 |
| JP | 2003-142272 | 5/2003 |
| WO | WO 90/13148 | 11/1990 |
| WO | WO 94/29883 | 12/1994 |
| WO | WO 98/10621 | 3/1998 |
| WO | WO 98/57381 | 12/1998 |
| WO | WO 99/21935 | 5/1999 |
| WO | WO 99/48160 | 9/1999 |
| WO | WO 00/48258 | 8/2000 |
| WO | WO 02/44189 A1 | 6/2002 |
| WO | WO 02/45466 A1 | 6/2002 |
| WO | WO 02/060910 A1 | 8/2002 |
| WO | WO 02/066552 A1 | 8/2002 |
| WO | WO 02/068435 A1 | 9/2002 |
| WO | WO 02/081448 A1 | 10/2002 |
| WO | WO 02/084759 A1 | 10/2002 |
| WO | WO03/001616 | 1/2003 |
| WO | WO 03/001616 A2 | 1/2003 |
| WO | WO03/074628 | 9/2003 |
| WO | WO 03/076548 A1 | 9/2003 |

OTHER PUBLICATIONS

A.R. Brown et al, "Optical Spectroscopy of Triplet Excitons and Charged Excitations in Poly (p-phenylenevinylene) Light-Emitting Diodes", Chemical Physics Letters, vol. 210, No. 1,2,3, Jul. 23, 1993, pp. 61-66.

M. Wohlgenannt et al., "Formation Cross-Sections of Singlet and Triplet Excitons in $\pi$-Conjugated Polymers", Letters of Nature, vol. 409, Jan. 2001, pp. 494-497.

M. Wohlgenannt et al., "Photophysics Properties of Blue-Emitting Polymers", Synthetic Metals 125, (2002), pp. 55-63.

Michael D. McGhee et al., "Narrow Bandwidth Luminescence from Blends with Energy Transfer from Semiconducting Conjugated Polymers to Europium Complexes", Advanced Material, 1999, No. 16, pp. 1349-1354.

M.A. Baldo et al., "Highly Efficient Phosphorescent Emission from Organic Electroluminescent Devices", Letters of Nature, vol. 395, Sep. 20, 1998, pp. 151-154.

M.A. Baldo et al., "Very High-Efficiency Green Organic Light-Emitting Devices Based on Electrophosphorescene", Applied Physics Letters, vol. 75, No. 1, Jul. 5, 1999, pp. 4-6.

Chihaya Adachi et al., High-Efficiency Organic Electrophoshorescent Devices with tris(2- phenylpyridine)iridium Doped Into Electron-Transporting Materials, Applied Physics Letters, vol. 77, No. 6, Aug. 7, 2000, pp. 904-906.

M.A. Baldo et al., "Phosphorescent Materials for Application to Organic Light Emitting Devices", Pure Appl. Chem., vol. 71, No. 11, 1991, pp. 2095-2106.

L.S. Hung et al., "Recent Progress of Molecular Organic Electroluminescent Materials and Devices", Material Science and Engineering R 39 (2002), pp. 143-222.

Mark E. Thompson et al., "Electrophosphorescent Organic Light Emitting Diodes", 2000, pp. 202-203.

C.W. Tang et al., "Electroluminescence of Doped Organic Thin Films", J. Appl. Phys. 85 (9), May 1, 1998, pp. 3610-3616.

Sang Woo Kim et al., Synthesis and Properties of Novel Triphenylamine Polymers Containing Ethynyl and Aromatic Moieties, Synthetic Metals 122, (2001), pp. 363-368.

C. David Müller et al., "Multi-Colour Organic Light-Emitting Displays by Solution Processing", Nature, vol. 421, Feb. 20, 2003, pp. 829-832.

Anthony F. Jacobine, "Thol-Ene Photopolymers", Chapter 7, Radiation Curing in Polymer Science and Technology—vol. III, Polymerisation Mechanismcs, 1993, pp. 219-266.

C.H. Chen et al., "Recent Developments in Molecular Organic Electroluminescent Materials", Macromol. Symp. 125, 1997, pp. 1-48.

H. Yamaguchi et al., "Effects of B and C on the Ordering of $L1_0$-CoPt Thin Films", Applied Physics Letters, vol. 79, No. 13, Sep. 24, 2001, pp. 2001-2003.

R.M. Nouguier et al., "Alkylation of Pentaerythritol and Trimethylolpropane, Two Very Hydrophillic Polyolcs, by Phase-Transfer Catalysis", J. Org. Chem., 1985, 50, pp. 3296-3298.

Alessandro Dondoni et al., Synthesis of Calix[4]arenylvinylene and Caliz[4] arenylvinylene Oligomers by Stille and Suzuki Cross-Coupling Reactions, J. Org. Chem. 1998, 63, pp. 9535-9539.

Wesley J. Dale et al., Substitute Styrenes. VII. The Syntheses and Some Reactions of the Vinylbenzeneboronic Acids, vol. 27, Jul. 1962, pp. 2598-2603.

Mukundan Thelakka, et al., "Low Molecular Weight and Polymeric Heterocyclics as Electron Transport/ Hole-Blocking Materials in Organic Light-Emitting Diodes", Polymers for Advanced Technologies, Polym. Adv. Technol. 9, 1998, pp. 429-442.

Yu-Hua Niu et al., "Thermal Annealing Below the Glass Transition Temperature: A General Way to Increase Performance of Light-Emitting Diodes Based on Copolyfluorenes", Applied Physics Letters, vol. 81, No. 4, Jul. 22, 2002, pp. 634-636.

Yasuhiko Shirota, Organic Materials for Electronic and Optoelectronic Devices, J. Mater. Chem., 2000, pp. 1-25.

Paul J. Flory, Effects of Cross-Linking and Branching on the Molecular Constitution of Diene Polymers, vol. 69, Cross-Linking and Branching Effects on Molecules of Diene Polymers, Nov. 1947, pp. 2893-2899.

J.L. Wardell, "Preparation of Thiols", Chapter 4, 1974, pp. 163-259.

Chinese Office Action mailed Jul. 4, 2008 and issued in corresponding Chinese Patent Application No. 200400268556.

* cited by examiner

ELECTROLUMINESCENT DEVICE

CROSS-REFERENCE TO RELATED APPLICATIONS

This is a Continuation Application of PCT Application No. PCT/GB2004/004024, filed Sep. 17, 2004, which was published under PCT Article 21(2) in English.

This application is based upon and claims the benefit of priority from prior United Kingdom Patent Application No. 0321781.7, filed Sep. 17, 2003, the entire contents of which are incorporated herein by reference.

BACKGROUND OF THE INVENTION

1. Field of the Invention

The present invention relates to organic electroluminescent devices, in particular phosphorescent organic electroluminescent devices.

2. Description of the Related Art

One class of opto-electrical devices attracting increasing attention is that using a semiconducting organic material for light emission (an electroluminescent device) or as the active component of a photocell or photodetector (a "photovoltaic" device). The basic structure of these devices is a semiconducting organic layer sandwiched between a cathode for injecting or accepting negative charge carriers (electrons) and an anode for injecting or accepting positive charge carriers (holes) into the organic layer.

In an organic light emitting device (OLED), electrons and holes are injected into the semiconducting organic layer where they combine to generate excitons that undergo radiative decay. Various classes of organic light emitting materials are known, in particular: polymers such as poly(p-phenylenevinylene) (as disclosed in WO 90/13148), polyfluorenes and polyphenylenes; the class of materials known as small molecule materials such as tris-(8-hydroxyquinoline)aluminium ("Alq$_3$") as disclosed in U.S. Pat. No. 4,539,507; and the class of materials known as dendrimers as disclosed in WO 99/21935. These materials electroluminesce by radiative decay of singlet excitons (i.e. fluorescence) however spin statistics dictate that up to 75% of excitons are triplet excitons which undergo non-radiative decay, i.e. the theoretical maximum of quantum efficiency for fluorescent OLEDs is 25%—see, for example, *Chem. Phys. Lett.*, 1993, 210, 61, *Nature (London)*, 2001, 409, 494, *Synth. Met.*, 2002, 125, 55 and references therein.

Accordingly, considerable effort has been directed towards producing luminescence from triplet excitons (phosphorescence) by utilising spin-orbit coupling effects in metal complexes that enable triplet excitons to undergo radiative decay. Examples of complexes investigated for this purpose include lanthanide metal chelates [*Adv. Mater.*, 1999, 11, 1349], a platinum (II) porphyrin [*Nature (London)*, 1998, 395, 151] and tris-phenylpyridine iridium (III) (hereinafter Ir(ppy)$_3$) [*Appl. Phys. Lett.*, 1999, 75, 4; *Appl. Phys. Lett.*, 2000, 77, 904]. Fuller reviews of such complexes may be found in *Pure Appl. Chem.*, 1999, 71, 2095, Materials Science & Engineering, R: Reports (2002), R39(5-6), 143-222 and Polymeric Materials Science and Engineering (2000), 83, 202-203.

The emissive layer of an OLED may consist of a neat film located between the anode and cathode, optionally with further charge transporting layers. In an alternative arrangement, the emissive material is provided as a dopant within a charge transporting host material. This arrangement may serve to increase device efficiency by improving charge transport and/or providing exciton transfer from the host material to the emissive material. The host-dopant arrangement may be applied to fluorescent materials as described in, for example, J. Appl. Phys. 65, 3610, 1989 or phosphorescent materials as described in the aforementioned disclosures of phosphorescent OLEDs.

The emissive layer of an OLED may be cross-linked to render it insoluble following its deposition. Cross-linking is particularly advantageous where the emissive material is soluble and may be otherwise be dissolved if further solution processing steps are undertaken.

Cross-linking may be used to form additional device layers by solution processing. For example, U.S. Pat. No. 6,107,452 discloses a method of forming a multilayer device wherein fluorene containing oligomers comprising terminal vinyl groups are deposited from solution and cross-linked to form insoluble polymers onto which additional layers may be deposited. Similarly, Kim et al, Synthetic Metals 122 (2001), 363-368 discloses polymers comprising triarylamine groups and ethynyl groups which may be cross-linked following deposition of the polymer.

Cross-linking may also be used for photolithographic patterning of an electroluminescent layer by UV cross-linking of the electroluminescent layer using a mask followed by washing of the electroluminescent layer with a solvent to remove non-cross-linked material. For example, further solution processing may be desirable in order to deposit additional device layers from solution and/or to wash away For example, Nature 421, 829-833, 2003 discloses a method of forming a full colour display by deposition of layers of red, green and blue electroluminescent polymers bearing oxetane side groups which are cross linked via a photoacid generator after deposition by exposure to the appropriate radiation. Similarly, JP 2003-142272 discloses a cross-linking of a hole transport layer, which may optionally be photopatterned, prior to deposition of the electroluminescent layer.

Thiol-ene polymers are known for use in photolithography (though not photolithography of OLEDs) —for example, see Jacobine, Radiat. Curing Polym. Sci. Technol., 1993, 3, 219-68.

Co-pending application PCT/GB 03/00899 describes use of thiol-ene polymers for photopatterning of OLEDs, in particular OLEDs comprising a host-dopant system as described above. This application describes charge transporting moieties comprising thiol or alkene groups that may be polymerised in the presence of an emissive material such as Ir(ppy)$_3$ to form an electroluminescent layer comprising a charge transporting host polymer matrix containing the emissive dopant material within the matrix. This layer may then be subjected to solution processing such as photopatterning. Although this approach serves to provide a functioning, patterned OLED, the present inventors have found that the processing steps following deposition of the electroluminescent layer causes the efficiency of photopatterned devices made according to this approach to be relatively low.

WO 03/01616 discloses monomers of phosphorescent complexes such as tris-phenylpyridine iridium (III) bearing acrylate groups. OLEDs comprising these complexes may be formed by polymerising the acrylate groups and then solution depositing the polymer onto the OLED substrate, or polymerising the monomer after its deposition. The latter case is preferred if the degree of cross-linking in the polymer renders it insoluble. This document discloses soluble and insoluble polymers, and does not disclose further solution processing steps following deposition of these polymers.

In view of the aforementioned problem of low efficiency, in particular for devices such as photopatterned devices, it is an object of the invention to provide a method of forming an electroluminescent device comprising a host-dopant electroluminescent layer having improved efficiency.

BRIEF SUMMARY OF THE INVENTION

The inventors have found that incorporation of the dopant of a host-dopant system into an insoluble polymer results in a significant improvement in device efficiency.

Accordingly, in a first aspect the invention provides a method of forming an electroluminescent device comprising the steps of:
providing a substrate comprising a first electrode for injecting charge carriers of a first type;
forming an electroluminescent layer having a surface by depositing onto the substrate a composition comprising a host material and a light-emitting dopant monomer of formula (I):

wherein X represents a polymerisable group; A represents a light-emitting group; C represents a bond or a spacer group and n is an integer;
rendering at least some of the electroluminescent layer insoluble in a solvent by polymerising the monomer of formula (I);
exposing the electroluminescent layer to the solvent; and
depositing a second electrode capable of injecting charge carriers of a second type over the electroluminescent layer.

Preferably, the composition comprises a second polymerisable group Y for copolymerisation with X.

X and Y may be selected from the same or different classes of polymerisable groups.

In one preferred embodiment, X and Y are selected from different classes of polymerisable groups. More preferably, one of X and Y is an optionally substituted thiol and the other comprises a reactive unsaturated carbon-carbon bond, preferably an optionally substituted alkene. Most preferably, X comprises a reactive unsaturated carbon-carbon bond, preferably an optionally substituted alkene.

In another preferred embodiment, X and Y are selected from the same class of polymerisable groups. More preferably, X and Y are the same or different and are both an optionally substituted thiol or are both a reactive unsaturated carbon-carbon bond, preferably an optionally substituted alkene. In this case, X and Y may polymerise directly together. Alternatively, X and Y may polymerise through a crosslinking agent. In a particularly preferred embodiment, X and Y both comprise an unsaturated carbon bond and the crosslinking agent comprises a plurality of thiol groups.

By "reactive unsaturated carbon-carbon bond" means a group that is capable of polymerisation with itself or with a co-monomer.

Preferably, n is at least 2.

Preferably, the host material is bound to a further first polymerisable group X or the second polymerisable group Y. More preferably, the host material is bound to at least 2 of the further first polymerisable group X or the second polymerisable group Y. Preferably, the host material is bound to at least one of the further first polymerisable group X.

Preferably, the light-emitting group is a phosphorescent compound. Preferably, the phosphorescent compound is a metal complex.

Suitable methods for polymerising the monomer of formula (I) include exposure of the monomer to UV light or thermal treatment. In one preferred embodiment, the step of polymerising the monomer of formula (I) comprises exposing only some of the surface of the electroluminescent layer to UV light. The subsequent step of exposing the electroluminescent layer to the solvent results in soluble material being washed away to leave a pattern of insoluble material.

In another preferred embodiment, the entire surface of the electroluminescent layer is rendered insoluble. In this embodiment, it is preferred that the subsequent step of exposing the electroluminescent layer to the solvent comprises formation of an electroactive layer by depositing over the electroluminescent layer a composition comprising the solvent and an electroactive material.

Preferably, the electroactive layer is a charge-transporting (i.e. hole or electron transporting) layer comprising a charge-transporting material.

In a second aspect, the invention provides an electroluminescent device obtainable by the method of the first aspect of the invention.

BRIEF DESCRIPTION OF THE SEVERAL VIEWS OF THE DRAWING

The invention will now be described in detail with reference to the drawings wherein.

DETAILED DESCRIPTION OF THE INVENTION

Figure 1:
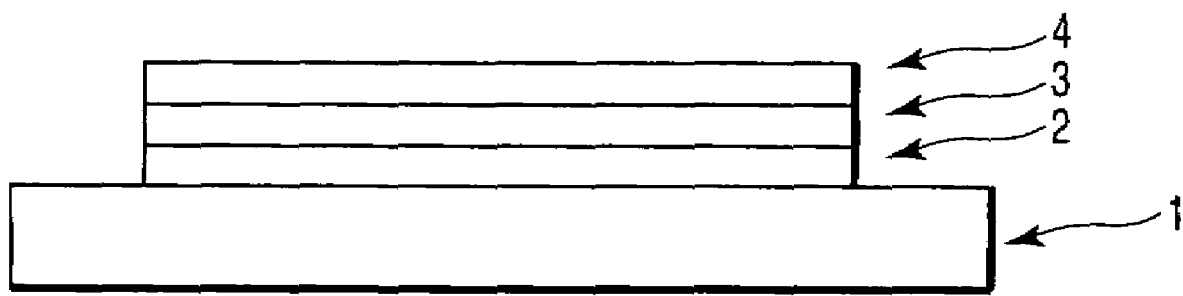
FIG. 1 illustrates a device made in accordance with the method of the invention.

With reference to FIG. 1, the standard architecture of an electroluminescent device according to the invention comprises a transparent glass or plastic substrate 1, an anode of indium tin oxide 2 and a cathode 4. The electroluminescent layer according to the invention is layer 3 between anode 2 and cathode 4.

In addition to layer 3, a separate hole transporting layer and/or an electron transporting layer may be provided.

Although not essential, a layer of organic hole injection material (not shown) between the anode 2 and the electroluminescent layer 3 may be desirable. Examples of organic hole injection materials include conducting polymers such as poly (ethylenedioxythiophene) (PEDT/PSS) as disclosed in EP 0901176 and EP 0947123, or polyaniline as disclosed in U.S. Pat. No. 5,723,873 and U.S. Pat. No. 5,798,170.

Electroluminescent layer 3 comprises a polymer having light emitting dopant groups bound to the polymer either as side-groups or as units within the polymer backbone. The monomers used to form the polymer are preferably soluble, but form an insoluble polymer. A solution-processing technique, such as spin-coating, ink-jet printing, dip-coating meniscus or roller coating, or other printing or coating technique, or thermal-transfer method may be used to deposit the monomer(s) to be polymerised.

The monomers may be polymerised by any suitable technique including heat treatment, chemical initiation and radiation, in particular UV radiation. One particularly suitable class of polymers are thiol-ene polymers. Where the monomer used in the method of the invention according to the invention comprises a reactive unsaturated carbon-carbon bond, this bond may be, for example, a non-aromatic group with carbon-carbon double or triple bonds. When used with a thiol, these materials form a thioether linkage. For steric reasons, the most reactive unsaturated carbon-carbon bonds are often located at a terminal position in the chain or branch.

Preferably, the polymerisation is initiated by exposure to actinic radiation in an inert atmosphere to avoid the formation of chemical initiators such as peroxy groups in the polymer. Following washing or developing of the film, the film may be dried or undergo other post-patterning treatment.

Photolithographic patterning of the light-emitting layer is achieved by use of a suitable photo-mask. A film that is capable of emitting a first colour is deposited, patterned and developed to form pixels capable of emitting a first colour. At this stage, since the film of the first colour is insoluble, it allows a film of a material that is capable of emitting a second colour to be deposited without disrupting the first colour film. This second film is patterned and developed to form pixels capable of emitting the second colour. The process can be repeated to deposit a material capable of emitting a third colour. If present, it may be appropriate to pattern a charge-transporting layer, and this can be done using the same masking technique.

Polymers such as thiol-ene polymers are formed by free-radical induced polymerisation. Optionally, the free-radical induced polymerisation can take place in the presence of a radical initiator. The insolubility of the resultant polymer in a solvent allows un-reacted monomers to be washed away. Insolubility is preferably achieved by polymerisation to produce a crosslinked polymer network.

Under the correct conditions, thioether and alkene groups react to form a thioether linkage. The reaction proceeds by a step growth mechanism, as outlined in Jacobine, Radiat. Curing Polym. Sci. Technol., 1993, 3, 219-68. The reaction is illustrated in the scheme below wherein A is a light-emitting dopant and B is a core through which the thiol functional groups are bound.

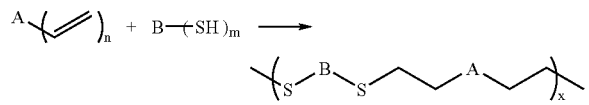

If each monomer has two functional groups (n=m=2) then a linear polymer can be formed. If at least one of n or m is greater than 2 then a crosslinked polymer can be formed. In order to incorporate the host material into the polymer shown above, a host material comprising at least two reactive unsaturated carbon-carbon bonds may be added to the monomers. Although the host material and light emitting dopant are described above as monomers with alkene reactive units, it will be appreciated that they could either or both have thiol reactive units. Furthermore, a monomer may comprise at least one thiol group and at least one reactive unsaturated carbon-carbon bond.

The monomers shown above produce a polymer wherein both groups A and B are located within the backbone of the polymer, however it will be appreciated that the monomers may be modified such that one or both of A and B are present as substituents pendant from the polymer backbone. An example of such a monomer is illustrated below:

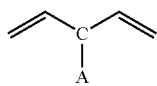

wherein n is at least 2 and C represents a spacer group which may suitably be selected from the set of spacer groups described below. Similarly, the double bonds may be replaced by thiol groups and/or the light emitting dopant A may be replaced by a charge-transporting moiety.

In principle, as many X groups as Y groups should be present for complete reaction to occur, if one group is in excess then the excess will remain un-reacted. However, as is well known, in a polymerisation reaction of multi-functional monomers assuming unlimited mobility not all functional groups react (P. J. Flory, J. Am. Chem. Soc. 1947, 69, 2893), so it is not thought to be critical that the number of X and Y groups is balanced.

Where a thiol-ene polymer is used, it is preferred for there to be a spacer chain between the light-emitting moiety and the polymerisable thiol or the reactive unsaturated carbon-carbon bond. Such a spacer improves the film forming properties of the material, allowing good quality films to be deposited from solution. The spacer also aids the polymerisation process. The spacer should not contain any carbonyl groups (including those in the form of esters, amides etc.). The spacer can comprise alkyl, ether, thioether, aryl, siloxane, amine or unsaturated groups, or heteroatoms such as silicon, boron or phosphorus.

Synthetic routes to form thiol-containing materials including those starting from thiourea, thiosulfate ions, thiol esters and dithiocarbamates can be found in S. Patai, Chapter 4, *The Chemistry of the Thiol Groups*, John Wiley & Sons, London 1974.

Figure 2:
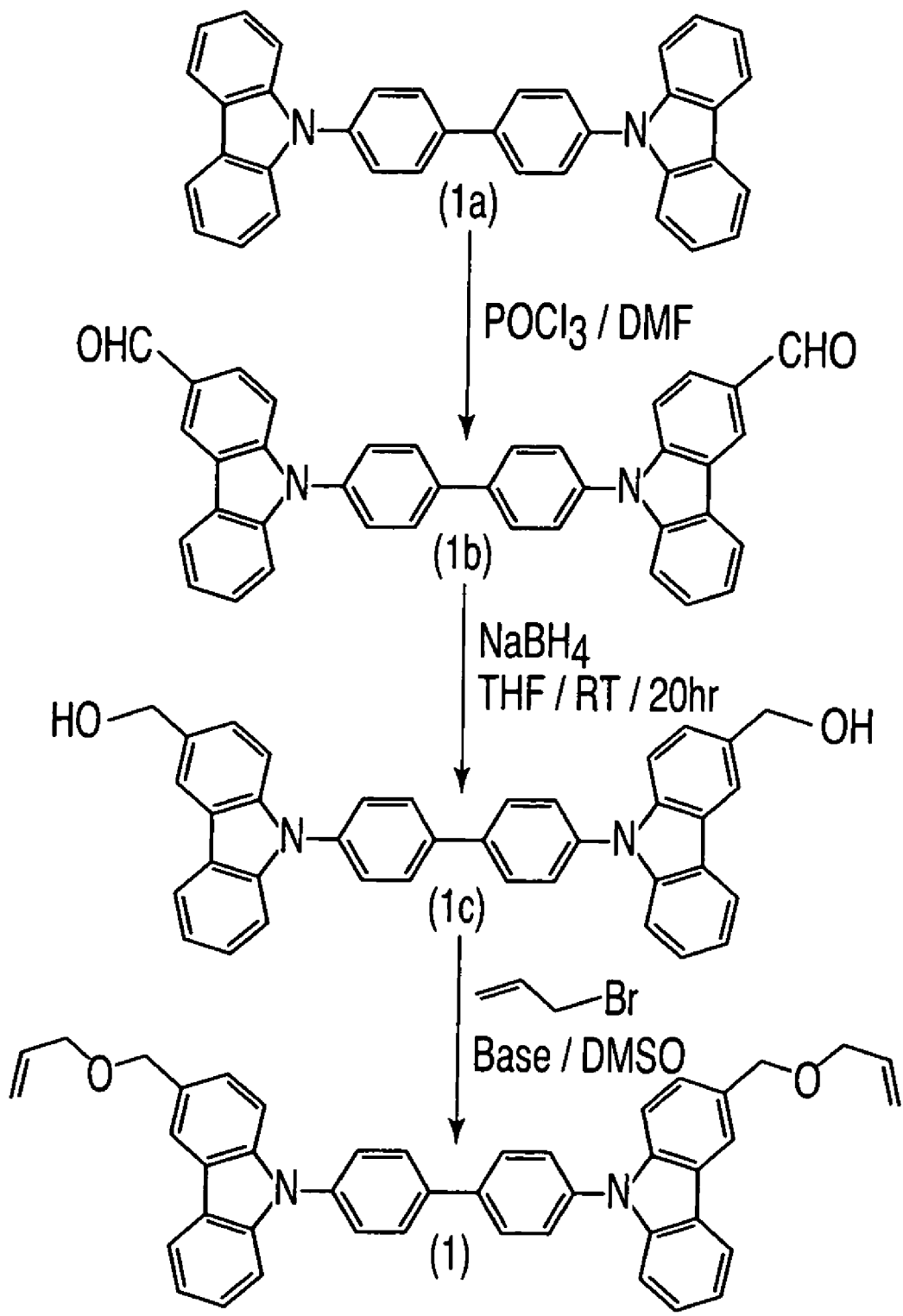
FIG. 2 illustrates the synthesis of the compound of formula (1).

A synthetic route to alkene materials that have an ether linkage between the reactive unsaturated carbon-carbon bond and the rest of the molecule, is via a nucleophilic substitution in the presence of base as shown in FIG. 2 (the step from compound 10c to compound 10). *Synthesis of ethers, Houben-Weyl, Methoden der organische Chemie, V*1/3, Georg Thieme Verlag, Stuttgart 1965.

Thiol-ene mixtures can be easily thermally-polymerized and photo-polymerised. Photo-polymerization has the advantage that good resolution patterned films can be obtained and hence photo-polymerization is preferred for OLED applications. The reactive unsaturated carbon-carbon bonds are preferably electron-rich or they form part of a strained ring system. In this later case, reaction of the unsaturated carbon-carbon bond with a thiol will then release the ring strain. The reactive unsaturated group consists preferably of a norbornyl or vinylether moiety, other useful enes consist of allylether, or unsaturated cyclic systems. For the thiol-ene systems there are suitable initiators for activation by either UV light or visible light. For successful initiation, it is generally preferable to use a wavelength of light that is absorbed by the initiator but not strongly absorbed by the other components of the film. In this way the initiator functions well and photo-degradation of the film is minimised.

The thiol-ene systems mentioned here do not contain any carbonyl groups therefore no quenching of luminescence is observed.

The light emitting dopant of the invention is preferably an optionally substituted metal complex of formula (V):

$$ML^1_q L^2_r L^3_s \qquad (V)$$

wherein M is a metal; each of $L^1$, $L^2$ and $L^3$ is a coordinating group; q is an integer; r and s are each independently 0 or an integer; and the sum of (a.q)+(b.r)+(c.s) is equal to the number of coordination sites available on M, wherein a is the number of coordination sites on $L^1$, b is the number of coordination sites on $L^2$ and c is the number of coordination sites on $L^3$.

The metal complex may be based on a relatively light element that produces fluorescence, for example an aluminium complex, most particularly $Alq_3$ as disclosed in J. Appl. Phys. 65, 3610, 1989. Alternatively, the complex may be based on heavy elements M that induce strong spin-orbit coupling to allow rapid intersystem crossing and emission from triplet states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, pallaidum, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form organometallic complexes with carbon or nitrogen donors such as porphyrin or bidentate ligands of formula (VI):

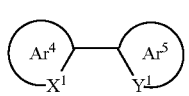

(VI)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

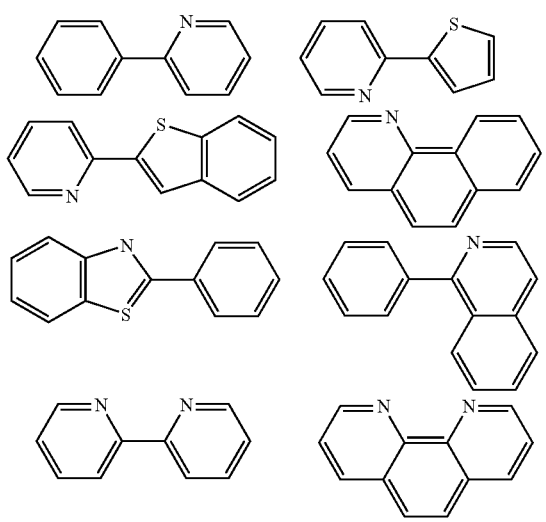

Each of $Ar^4$ and $Ar^5$ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal. A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014], in particular tris-(8-hydroxyquinoline) aluminium. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

Suitable fluorescent blue emitters are e.g. stilbenes, coumarins, anthracences (Kodak U.S. Pat. No. 5,972,247 (1999). Toshio et al (Toyo Ink) EP 0765106 (1996)) and perylenes (So et al (Motorola) U.S. Pat. No. 5,853,905 (1997). Lee et al (Motorola) U.S. Pat. No. 5,747,183 (1996)). Also suitable are blue-emitting aluminium complexes (Bryan et al (Kodak) U.S. Pat. No. 5,141,671. Van Slyke et al (Kodak) U.S. Pat. No. 5,150,006)). Suitable green emitters are $Alq_3$ (Chen and Tang, Macromol. Symp. 1997, 125, 1-48), coumarins (Chen et al (Kodak) U.S. Pat. No. 6,020,078) and quinacridone (Shi et al (Kodak) U.S. Pat. No. 5,593,788). Suitable red emitters are DCM and its derivatives (Chen et al, U.S. Pat. No. 5,908,581). The fluorescent material can be a molecular or dendritic species. For examples of suitable fluorescent dendrimers see for example WO 99/21935.

Where the light-emitting dopant is phosphorescent, it is necessary for the host to possess a higher $T_1$ energy level than the dopant. Examples of suitable host materials are those comprising triarylamine units (for examples see Shirota, J. Mater. Chem., 2000, 10, 1-25) or carbazole units, in particular poly(vinylcarbazole).

The host material may also have charge transporting properties. Hole transporting host materials are particularly preferred such as the hole-transporting arylamine having the following formula:

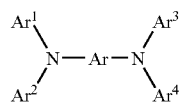

wherein Ar is an optionally substituted aromatic group, such as phenyl, or

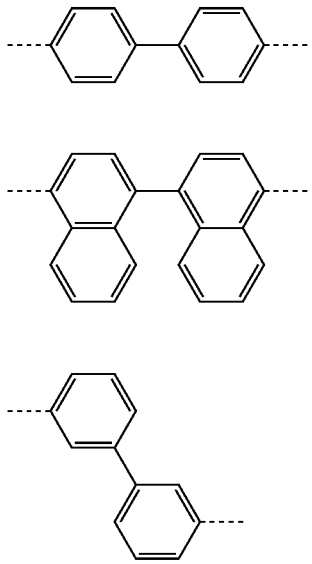

and $Ar^1$, $Ar^2$, $Ar^3$ and $Ar^4$ are optionally substituted aromatic or heteroaromatic groups (Shi et al (Kodak) U.S. Pat. No. 5,554,450. Van Slyke et al, U.S. Pat. No. 5,061,569. So et al (Motorola) U.S. Pat. No. 5,853,905 (1997)). Ar is preferably biphenyl. In the current invention at least two of $Ar^1$, $Ar^2$, $Ar^3$ and $Ar^4$ are bonded to either a thiol group, X, or a group containing a reactive unsaturated carbon-carbon bond, Y. $Ar^1$ and $Ar^2$, and/or $Ar^3$ and $Ar^4$ are optionally linked to form a N containing ring, for example so that the N forms part of a carbazole unit e.g.

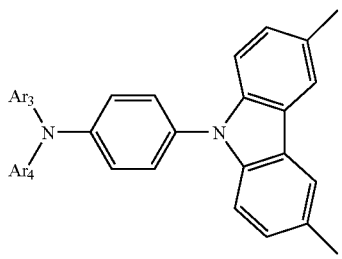

Charge transport/host materials may be bipolar, i.e. capable of transporting holes and electrons. Suitable bipolar materials preferably contain at least two carbazole units (Shirota, J. Mater. Chem., 2000, 10, 1-25).

The concentration of the fluorescent or phosphorescent light-emitting dopant in the host material should be such that the film has a high photoluminescent and electroluminescent efficiency. If the concentration of the emissive species is too high, quenching of luminescence can occur. A concentration in the range 0.01-49 molar %, is generally appropriate.

The OLED may comprise further semiconducting layers in addition to the electroluminescent layer. In particular, charge transporting and/or blocking layers may be used. Materials suitable for forming hole-transporting/electron blocking layers are π-electron rich, in particular triarylamines (for examples see Shirota, J. Mater. Chem., 2000, 10, 1-25) and those amine and carbazole containing compounds described above as host materials.

If the light emitter is phosphorescent, it is particularly beneficial that either an electron-transporting layer is present that also functions as a hole-blocking layer, or that a hole-blocking layer is present between the light-emitting layer and an electron-transporting layer.

Electron-transporting materials contain π-electron deficient moieties. Examples of suitable π-electron deficient moieties are oxadiazoles, triazines, pyridine, pyrimidine, quinoline, and quinoxaline (Thelakkat, Schmidt, Polym. Adv. Technol. 1998, 9, 429-42). Specific examples include $Alq_3$ [Aluminium tri(8-hydroxyquinoline)], TAZ (3-phenyl-4-(1-naphthyl)-5-phenyl-1,2,4-triazole) and OXD-7 (1,3-bis(N,N-t-butyl-phenyl)-1,3,4-oxadiazole).

A layer of electron transporting and/or hole blocking material (not shown) may be provided between the electroluminescent layer 3 and the cathode layer 4. As with the hole transporting or injecting layer, an electron transporting and/or hole blocking material is not essential.

Cathode 4 is selected from materials that have a workfunction allowing injection of electrons into the electroluminescent layer or electron transporting layer, if present. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 2001.

A typical electroluminescent device comprises an anode having a workfunction of 4.8 eV. Accordingly, the HOMO level of the hole transporting material, if any, is preferably around 4.8-5.5 eV. Similarly, the cathode of a typical device will have a workfunction of around 3 eV. Accordingly, the LUMO level of the electron transporting material, if any, is preferably around 3-3.5 eV.

Electroluminescent layer 3 may comprise the host material and light emitting material according to the invention alone or one or more additional materials. In particular, layer 3 may comprise the host material and light emitting material blended with one or more of a hole transporting polymer and an electron transporting polymer as disclosed in WO 99/48160.

Electroluminescent devices may be monochrome devices or full colour devices (i.e. formed from red, green and blue electroluminescent materials).

The devices may be unpatterned, passive matrix or active matrix devices.
EXAMPLES
A) Materials
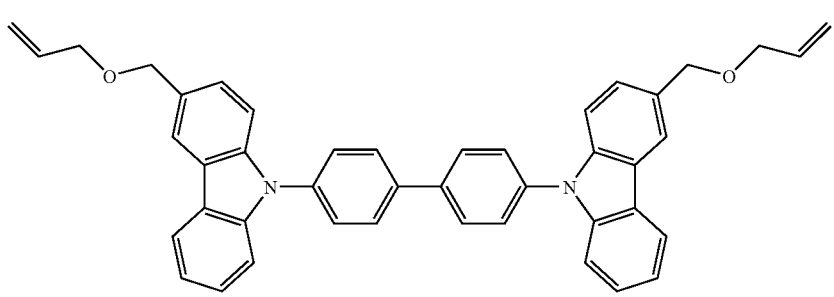
1
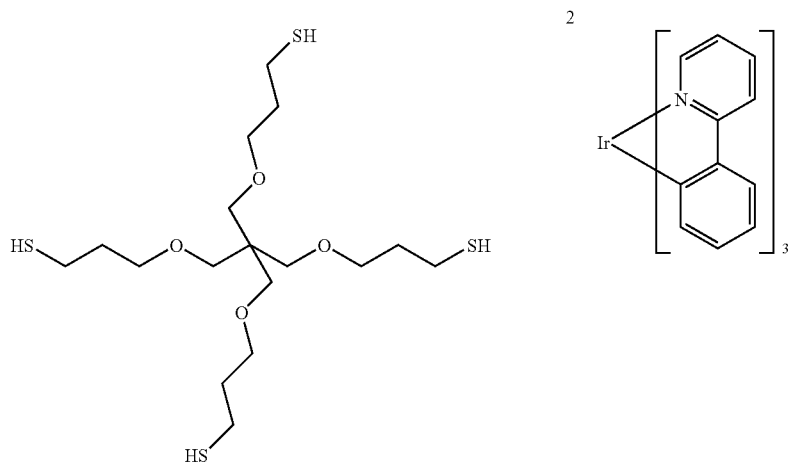
2
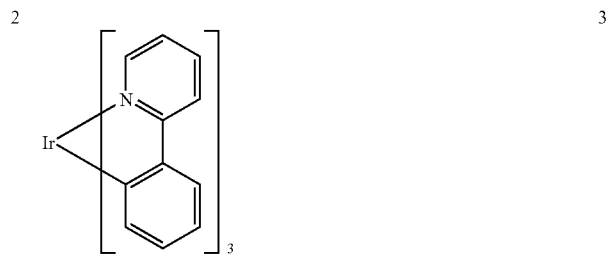
3
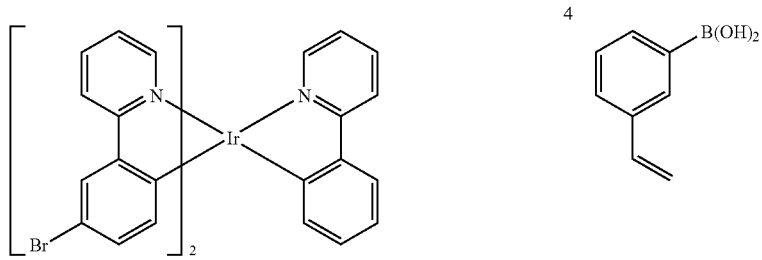
4
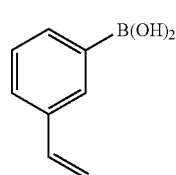
5
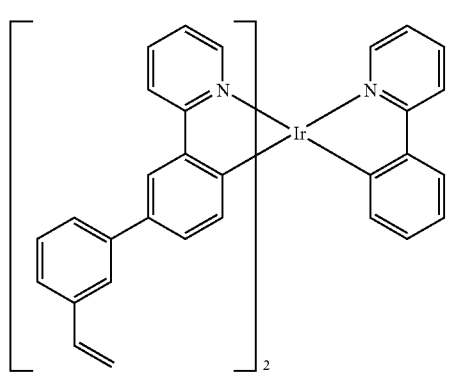
6

B) Synthesis

Synthesis of 4,4'-bis(3-(allyloxymethyl)carbazol-9-yl) (1)

The compound of formula (1) was synthesised according to the scheme shown in FIG. 2:

i) Synthesis of 4,4'-bis(carbazol-9-yl)biphenyl (1a)

Phosphorus tert-butyl phosphine (880 mg, 4.35 mmol) in toluene (88 ml) was added under nitrogen to a deoxygenated mixture of carbazole (11.9 g, 71.0 mmol), 4,4'-dibromobiphenyl (10.0 g, 32.11 mmol), sodium tert-butoxide (23.2 g, 241 mmol) and palladium acetate (324 mg, 1.34 mmol) in toluene (50 ml) and the resulting mixture was heated at reflux under nitrogen for 10 days. The reaction mixture was cooled to room temperature and then diluted with more toluene (200 ml). The reaction mixture was filtered to removes sodium salt and the filtrate was removed all traces of the product. The filtrate was concentrated to dryness to give the crude product as a pale brown solid. The crude product was purified first by chromatography on silica using dichloromethane as the eluent followed by recrystallisation from toluene. The material was then sublimed at 280-281° C. at $10^{-6}$ mm Hg to give the product 4,4'-bis(carbazol-9-yl)biphenyl as an off-white solid with melting point 280-281° C. (lit. m.p. 281° C.).

ii) Synthesis of the 4,4'-bis(3-formylcarbazol-9-yl)biphenyl (1b)

Phosphorus oxychloride (13 ml, 21.5 g, 140 mmol) was added dropwise to a stirring mixture of N,N-dimethylformamide (5.40 ml, 5.10 g, 69.7 mmol) and 4,4'-bis(carbazol-9-yl)biphenyl (7.72 g, 16.0 mmol) and the resulting mixture was stirred at room temperature for 5 minutes then heated to 90° C. for 24 h. (nb reaction mixture was followed by TLC using 5% ethanol/dichloromethane as the eluent). The reaction mixture was poured into water (800 ml) and this beaker was placed in the ultrasonic bath for 2 hours to break up the material. The mixture was stirred for a further 2 hours then filtered. The residue was washed with water and then hexane and dried in vacuo for 2 hours. The crude product was heated with acetone (3×400 ml) and filtered. The product was insoluble in most organic solvent. The impurities were removed by washing with acetone. The product, 4,4'-bis(3-formyl-carbazol-9-yl)biphenyl, (7.92 g, 87%) was obtained with melting point 295° C. (dec.). Found: C, 81.74; H, 4.71; and N, 4.45. $C_{38}H_{28}N_2O_2.(CH_3)_2CO$ requires C, 82.25; H, 5.05; N, 4.68%. $^1$H n.m.r. (300 MHz, Me$_2$SO): δ 10.09 (2 H, s, CHO); 8.88 (2 H, d, J 0.88 Hz, aromatic H); 8.41 (2 H, d, J 7.61 Hz, aromatic H); 8.41 (4 H, d, J 8.49 Hz, aromatic H); 8.00 (2 H, dd, J 8.49, 1.46 Hz, aromatic H); 7.83 (4 H, d, J 8.49 Hz, aromatic H); 7.38-7.61 (8 H, m, aromatic H). $\lambda_{max}$ (CH$_2$Cl$_2$): 215 nm (ε/Lmol$^{-1}$cm$^{-1}$ 9163), 241 (68 488), 272 (65 928), 294 (67 194) 328 (42 620). FT-IR (solid): 3045, 2825, 2730, 1682, 1623, 1591, 1505, 1456, 1438, 1365, 1319, 1275, 1230, 1180, 802, 745 cm$^{-1}$.

iii) Synthesis of the 4,4'-bis(3-(hydroxymethyl)carbazol-9-yl)biphenyl (1c)

Sodium borohydride (2.40 g, 63.4 mmol)) was added to the 4,4'-bis(3-formylcarbazol-9-yl)biphenyl (3.42 g, 6.33 mmol) in THF (1.2 L) and the resulting suspension was stirred at room temperature for 24 h. The reaction was followed by TLC using 5% ethanol/dichloromethane as the eluent. Once the reaction was complete, the mixture was slowly poured into water (400 ml) and the mixture was left to stir at room temperature for a further 30 min. The reaction mixture was acidified to pH 1 with hydrochloric acid (5M). The product was extracted with dichloromethane (3×300 ml). The combined organic phase was washed with water (400 ml) and brine (400 ml), dried (MgSO$_4$), filtered and the filtrate evaporated to dryness. The crude product, was purified by chromatography on silica using 50% THF/toluene as the eluent. The product was recrystallised from ethanol to give 4,4'-bis(3-(hydroxymethyl)carbazol-9-yl) biphenyl as a pale yellow solid (3.22 g, 94%) with m.p. 268° C. (dec.). Found: C, 82.51; H, 4.64; and N, 4.86. $C_{38}H_{28}N_2O_2$.EtOH requires C, 81.33; H, 5.80; N, 4.74%. $^1$H n.m.r.(300 MHz, Me$_2$SO): δ 8.23 (2 H, d, J 7.61 Hz, aromatic H); 8.18 (2 H, s, aromatic H); 8.06 (4 H, d, J 8.19 Hz, aromatic H); 7.75 (4 H, J 8,19 Hz, aromatic H); 7.38-7.50 (8 H, m, aromatic H), 7.29 (2 H, m, aromatic H); 5.25 (2H, t, J 5.58 Hz, OH); 4.68 (4H, d, J 5.56 Hz, CH$_2$). $\lambda_{max}$(CH$_2$Cl$_2$): 216 nm (ε/Lmol$^{-1}$cm$^{-1}$ 177 455), 240 (57 873), 271 (56 595), 294 (55 330) 329 (37 758). FTIR (solid): 3343, 1604, 1500, 1485, 1455, 1362, 1330, 1230, 803, 745 cm$^1$.

iv) Synthesis of 4,4'-bis(3-(allyloxymethyl)carbazol-9-yl) biphenyl (1)

DMSO was dried over calcium hydride, then distilled under vacuum and stored over molecular sieves.

Potassium hydroxide (2.07 g, 36.9 mmol) was added to DMSO (20 ml) and was stirred under nitrogen at room temperature for 15 min. The diol (2.39 g, 4.39 mmol) in DMSO (20 ml) was then added, followed by allyl bromide (2 ml, 2.80 g, 21.7 mmol) and the resulting mixture was stirred at room temperature under nitrogen overnight. The reaction mixture was poured into water (200 ml) and the product was extracted into dichloromethane (3×50 ml). The organic phases were combined and were washed with water (5×150 ml), brine (200 ml) and dried over magnesium sulfate. The mixture was filtered and the filtrate was evaporated to dryness. The material was purified by chromatography on silica using dichloromethane as the eluent. The relevant fractions were combined and the solvent removed under reduced pressure. The product was triturated from dichloromethane and hexane to give the product as a pale yellow solid with melting point 118-120° C. (Found: C, 82.51; H, 4.64; and N, 4.86. $C_{38}H_{28}N_2O_2$.EtOH requires C, 81.33; H, 5.80; N, 4.74%). $^1$H n.m.r. (300 MHz, Me$_2$SO): δ 8.13-8.20 (4 H, m, aromatic H); 7.87-7.93 (4 H, m, aromatic H); 7.65-7.72 (4 H, m, aromatic H); 7.40-7.65 (8 H, aromatic H); 7.27-7.35 (2 H, m, aromatic H); 5.93-6.09, (2H, m, CH=CH), 5.30-5.39 (2H, m, CH=CH); 5.20-5.29 (2H, m, CH=CH); 4.74 (4H, s, CH$_2$); (8H, m, CH$_2$—CH=CH$_2$). $\lambda_{max}$(CH$_2$Cl$_2$): 241 nm (ε/Lmol$^{-1}$cm$^{-1}$ 88 506), 296 (40 331), 319 (29657). FT-IR (solid): 3047, 2852, 1604, 1500, 1455, 1359, 1331, 1230, 1074, 915, 807, 759 cm$^{-1}$.

Synthesis of Tetrathiopropylpentaerythritol (2)

The compound of formula (2) was prepared in a two-step synthesis starting from tetraallylpentaerythritol as disclosed in Nouguier R, Mchich M, *J. Org. Chem.* 1985, 50, (3296-3298).

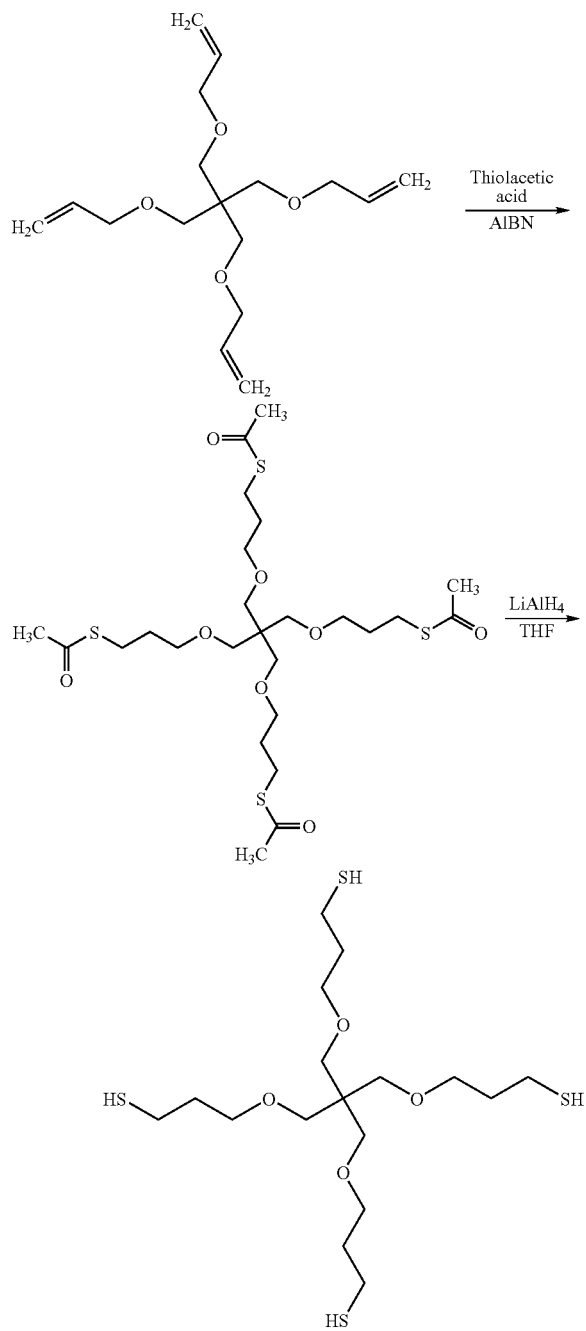

i) Synthesis of Tetrathioacetylpropylpentaerythritol 2.0 g (6.74 mmol) of tetraallylpentaerythritol was added to a 10 ml round bottomed flask fitted with a stirrer. The reagent was cooled on an ice-bath where 4.11 g (53.98 mmol) of freshly distilled thiolacetic acid was added in 1 ml portions. After the addition was complete 5 mg of AIBN was added and the reaction mixture stirred for 15 mins. When the AIBN had dissolved the reaction mixture was heated at 60° C. for 12 hours, the reaction being followed by T.L.C. The product of the reaction had an $R_f$ of 0.05 in dichloromethane (DCM) on silica and an $R_f$ of 0.9 in ethanol. The excess thiolacetic acid was removed from the reaction mixture under vacuum and the residue applied to a short silica column in the minimum volume of DCM. The column was eluted with 500 ml of DCM followed by 500 ml of ethanol. The ethanol fraction was collected and the solvent removed. 2.9 g (71.5% yield) of tetrathioacetylpropylpentaerythritol was isolated as a pale yellow oil.

$^1$H NMR (CDCl$_3$) ppm: 3.41 (triplet, 8H) 3.34 (singlet, 8H) 2.92 (triplet, 8H) 2.32 (singlet, 12H) 1.80 (quintet, 8H)I.R (cm$^{-1}$): 2866, 1686, 1354, 1099, 953 ii) Synthesis of Tetrathiopropylpentaerythritol (2)

1.8 g (2.99 mmol) of tetrathioacetylpropylpentaerythritol was added to 10 ml of anhydrous THF in a 100 ml round bottomed flask and the mixture was degassed with stirring. The reaction vessel was purged with nitrogen and 12.3 ml of 1M LiAlH$_4$ in THF was added dropwise. The reaction was allowed to stir at room temperature for 18 hours, the reaction being monitored by T.L.C. (dichloromethane). When the reaction was complete the mixture was acidified to pH 3 with 0.1M HCl and 50 ml of DCM added. The organic phase was collected, the aqueous phase extracted with 2×50 ml of DCM. The organic phases were combined and extracted with 4×100 ml brine and 2×50 ml of water. The organic phase was dried over sodium sulphate, filtered and the solvent removed. The product was isolated as a pale yellow oil with a mass of 0.92 g (71.2% yield). The product was distilled on Kugelrohr apparatus to yield a mobile colourless oil, B.P 230° C.@10$^{-4}$ mbar.

$^1$H NMR (CDCl$_3$) ppm: 3.47 (triplet, 8H) 3.34 (singlet, 8H) 2.60 (quartet, 8H), 1.84 (quintet, 8H) 1.38 (triplet, 4H)I.R (cm$^{-1}$): 2864, 1368, 1101

Fac-Tris[2-(2-pyridinyl-κN)phenyl-κC]-iridium(III) (3) was synthesised as described in WO 02/060910.

Fac-[2-(2-pyridinyl-κN)phenyl-κC]-bis[2-(2-pyridinyl-κN)(5-bromophenyl)-κC]-iridium(III) (4) was synthesised as described in WO 02/068435.

3-Styrylboronic acid (5) was synthesised by the method of Dondoni et al. (*J. Org. Chem.*, 1998, 63, 9535). The analytical data for (5) was in agreement with that reported by Rush et al. (*J. Org. Chem.*, 1962, 27, 2598).

fac-[2-(2-pyridinyl-κN)phenyl-κC]-bis[2-(2-pyridinyl-κN){5-(3-styryl)phenyl}-κC]-iridium(III) (6)

A suspension of 4 (0.582 g, 0.717 mmol) in toluene (90 cm$^3$) was treated with a solution of 5 (0.294 g, 1.79 mmol) in ethanol (40 cm$^3$), a solution of aqueous sodium carbonate (0.9 cm$^3$, 1.79 mmol) and water (30 cm$^3$). The mixture was bubbled with nitrogen gas for 75 mins. Against a flow of nitrogen, solid tetrakis(triphenylphosphine) palladium (0.040 g, 0.036 mmol) was added to the mixture. The mixture was then heated to reflux under nitrogen. On reaching reflux the suspension clarified, turning from a yellow suspension to an orange mixture. The mixture was kept at reflux under nitrogen for 14.5 hrs and then cooled to room temperature. On cooling the reaction mixture to room temperature both phases were clear. The mixture was treated with dichloromethane (100 cm$^3$) and the organic phase was separated. The aqueous phase was washed with dichloromethane (2×50 cm$^3$). The combined organic extracts were washed with water (40 cm$^3$). The combined organic extracts were then dried with magnesium sulfate, filtered and concentrated in vacuo. The crude product was purified by chromatography on silica gel, eluent 1:1 dichloromethane/hexane. The product was isolated as a yellow powder (0.560 g, 90%). $^1$H nmr (300 MHz, CDCl$_3$): 8.1-7.4 (16H, m), 7.4-7.3 (4H, m), 7.2-7.1 (2H, m), 7.0-6.7

(10H, m), 5.79 (2H, d, J=18 Hz), 5.30 (CH$_2$Cl$_2$), 5.25 (2H, d, J=11 Hz). ES-MS: 860.20 (MH$^+$). EA: Found C, 63.55; H, 4.17; N, 4.97; IrC$_{49}$H$_{36}$N$_3$.CH$_2$Cl$_2$ requires C, 63.62; H, 4.06; N, 4.45;

C) Fabrication of Phosphorescent Emitter Doped Photo-crosslinkable OLEDs

Host material 1 (8 mg), phosphorescent dopant 3 (8 wt %) and thiol 2 (1.8 mg) were dissolved in 1.5 ml pure chloroform (total concentration 5-7 mg ml$^{-1}$). An emissive layer was formed by spinning the solutions onto ITO coated glass substrates (previously cleaned by ultrasonication in commercial detergent and thorough rinsing with deionised water and plasma-treated in an Emitech K1050X plasma unit (process gas oxygen, 100 W, 2 min)). Solutions were spun onto the substrates at 2000 rpm with acceleration 500 rs$^{-1}$ for a total of 30 s giving an emissive layer of thickness ca 50 nm. Films were then photopolymerized under an inert atmosphere (N$_2$) using a Hanovir UVA 250W UV source. The films were irradiated for 6-8 minutes through a 5"×5" glass photo mask (cut-off 360 nm) giving a rectangular exposed area 15 mm×20 mm. The photopolymerized films were developed by rinsing with pure toluene, dried under a stream of dry nitrogen and transferred to the evaporator (Kurt J Lesker) for completion of the OLED by evaporation of a 50 nm thick electron transporting layer/hole blocking layer TPBI (illustrated below) and a top electrode (cathode) of a bilayer of LiF (1.2 nm) and Aluminium (100-150 nm). The overlap between the anode and the cathode define active areas consisting of 6 pixels measuring 4 mm×5 mm.

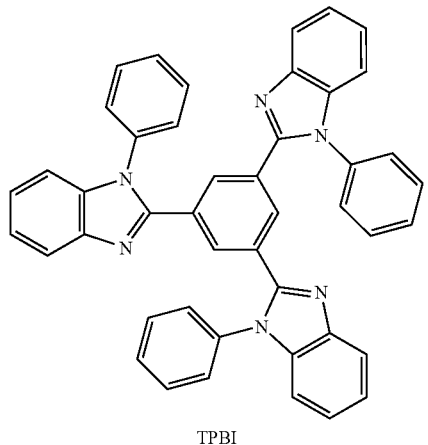

TPBI

For the purpose of comparison, an identical device was made except that 7 wt % of Ir(ppy)$_3$ (3) was used in place of polymerisable material (6).

D) Device Performance

Device results at 100 cd/m$^2$

| Dopant | Efficiency (cd/A) | Efficiency (lm/W) | Operating voltage (V) | Turn-on voltage (V) | Max. luminance (cd/m$^2$) (@V) | CIE coordinates (x, y) |
|---|---|---|---|---|---|---|
| 3 | 8.22 | 3.49 | 7.4 | 5.2 | 911 (10.0) | 0.33, 0.61 |

-continued

| Dopant | Efficiency (cd/A) | Efficiency (lm/W) | Operating voltage (V) | Turn-on voltage (V) | Max. luminance (cd/m$^2$) (@V) | CIE coordinates (x, y) |
|---|---|---|---|---|---|---|
| 6 | 22.6 | 12.5 | 5.7 | 4.4 | 2311 (10.0) | 0.34, 0.61 |

As can be seen from these results, the device made in accordance with the method of the invention shows dramatic improvement in many aspects of performance.

Without wishing to be bound by any theory, it is believed that the advantage of the invention derives from the light emitting group being immobilised on the polymer chain which prevents it from being washed out of the host matrix. Furthermore, fixing both the emitter and host material within a polymer backbone may contribute to improved efficiency due to the emitter and host material being set at a fixed distance from each other.

Furthermore, the present inventors have found that good resolution can be achieved by use of a thiol-ene photo-patterned polymer.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

What is claimed is:

1. A method of forming an electroluminescent device comprising:
    providing a substrate comprising a first electrode for injecting charge carriers of a first type;
    forming an electroluminescent layer having a surface by depositing onto the substrate a composition comprising a host material, a light-emitting dopant monomer of formula (I) and a second polymerisable group Y for copolymerization with X, one of X and Y being an optionally substituted thiol and the other is a group comprising a reactive unsaturated carbon-carbon bond:

$$A\text{-}C\text{—}(X)_n \qquad (I)$$

wherein X represents a polymerisable group; A represents a light-emitting group; C represents a bond or a spacer group; and n is 1;
    rendering at least some of the electroluminescent layer insoluble in a solvent by polymerising the monomer of formula (I);
    exposing the electroluminescent layer to the solvent; and
    depositing a second electrode capable of injecting charge carriers of a second type over the electroluminescent layer.

2. A method according to claim 1, wherein the host material is bound to a further first polymerisable group X or the second polymerisable group Y.

3. A method according to claim 1 wherein the light-emitting group is a phosphorescent compound.

4. A method according to claim 1, wherein the polymerising the monomer of formula (I) comprises exposing only some of the surface of the electroluminescent layer to UV light such that only the portion of the surface of the electroluminescent layer that is exposed to UV light rendered insoluble to the solvent and the exposing the electroluminescent layer to the solvent results in soluble material being washed away to leave a patterned insoluble electroluminescent layer.

5. A method according to claim 1, wherein the entire surface of the electroluminescent layer is rendered insoluble.

6. A method according to claim 4, wherein the exposing the electroluminescent layer to the solvent comprises forming an electroactive layer by depositing over the electroluminescent layer a composition comprising the solvent and an electroactive material.

* * * * *

UNITED STATES PATENT AND TRADEMARK OFFICE
CERTIFICATE OF CORRECTION

PATENT NO. : 7,700,148 B2  Page 1 of 1
APPLICATION NO. : 11/377613
DATED : April 20, 2010
INVENTOR(S) : Annette Steudel et al.

It is certified that error appears in the above-identified patent and that said Letters Patent is hereby corrected as shown below:

Column 18, Line 61 (claim 3), change "claim 1" to --claim 1,--

Signed and Sealed this

Seventeenth Day of August, 2010

David J. Kappos
*Director of the United States Patent and Trademark Office*